(12) United States Patent
Choi et al.

(10) Patent No.: US 9,064,999 B2
(45) Date of Patent: Jun. 23, 2015

(54) SOLAR CELL AND METHOD FOR MANUFACTURING THE SAME

(75) Inventors: Wonseok Choi, Seoul (KR); Kwangsun Ji, Seoul (KR); Heonmin Lee, Seoul (KR); Hojung Syn, Seoul (KR); Junghoon Choi, Seoul (KR); Hyunjin Yang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 127 days.

(21) Appl. No.: 12/876,847

(22) Filed: Sep. 7, 2010

(65) Prior Publication Data

US 2011/0056550 A1 Mar. 10, 2011

(30) Foreign Application Priority Data

Sep. 7, 2009 (KR) .................. 10-2009-0084046
May 11, 2010 (KR) .................. 10-2010-0043961
Aug. 3, 2010 (KR) .................. 10-2010-0075028

(51) Int. Cl.
| H01L 31/0352 | (2006.01) |
| H01L 31/068 | (2012.01) |
| H01L 31/0216 | (2014.01) |
| H01L 31/0224 | (2006.01) |
| H01L 31/0747 | (2012.01) |

(52) U.S. Cl.
CPC ...... *H01L 31/0682* (2013.01); *H01L 31/03529* (2013.01); *H01L 31/02167* (2013.01); *H01L 31/022441* (2013.01); *H01L 31/0747* (2013.01); *Y02E 10/547* (2013.01)

(58) Field of Classification Search
CPC ................ H01L 31/00; H01L 31/0352; H01L 31/03529

USPC ................................................ 136/243–265
See application file for complete search history.

(56) References Cited

U.S. PATENT DOCUMENTS

| 4,219,830 A | * | 8/1980 | Gibbons ...................... 136/255 |
| 6,313,397 B1 | * | 11/2001 | Washio et al. ................. 136/256 |
| 6,387,726 B1 | | 5/2002 | Verlinden et al. |

(Continued)

FOREIGN PATENT DOCUMENTS

| CN | 1862840 A | 11/2006 |
| CN | 101097969 A | 1/2008 |

(Continued)

OTHER PUBLICATIONS

Lu et al., Rear surface passivation of interdigitated back contact silicon heterojunction solar cell and 2D simulation study, 33rd IEEE Photovoltaic Specialist Conference, May 11-16, 2008.

*Primary Examiner* — Christina Chern
(74) *Attorney, Agent, or Firm* — Birch, Stewart, Kolasch & Birch, LLP

(57) ABSTRACT

A solar cell and a method for manufacturing the same are disclosed. The solar cell includes a substrate that contains first impurities of a first conductive type and is formed of a crystalline semiconductor, a first field region that is positioned on an incident surface of the substrate and contains second impurities of a second conductive type, an emitter region that contains third impurities of a third conductive type, is formed of a non-crystalline semiconductor, and is positioned on a non-incident surface of the substrate opposite the incident surface of the substrate, a first electrode electrically connected to the emitter region, and a second electrode electrically connected to the substrate.

5 Claims, 8 Drawing Sheets

(56) References Cited

U.S. PATENT DOCUMENTS

| | | |
|---|---|---|
| 6,927,417 B2 | 8/2005 | Nagashima et al. |
| 7,339,110 B1 | 3/2008 | Mulligan et al. |
| 7,468,485 B1 | 12/2008 | Swanson |
| 2004/0200520 A1* | 10/2004 | Mulligan et al. ............... 136/256 |
| 2004/0259335 A1* | 12/2004 | Narayanan et al. ........... 438/584 |
| 2006/0196535 A1 | 9/2006 | Swanson et al. |
| 2006/0255340 A1 | 11/2006 | Manivannan et al. |
| 2007/0169808 A1* | 7/2007 | Kherani et al. ................ 136/258 |
| 2008/0000522 A1 | 1/2008 | Johnson et al. |
| 2008/0076203 A1* | 3/2008 | Ribeyron et al. ............... 438/72 |
| 2008/0156370 A1* | 7/2008 | Abdallah et al. .............. 136/258 |
| 2008/0173347 A1 | 7/2008 | Korevaar et al. |
| 2008/0283490 A1 | 11/2008 | Luan et al. |
| 2009/0014063 A1 | 1/2009 | Stangl et al. |
| 2009/0151784 A1 | 6/2009 | Luan et al. |
| 2009/0211623 A1* | 8/2009 | Meier et al. ................... 136/246 |
| 2009/0223562 A1* | 9/2009 | Niira et al. ..................... 136/256 |
| 2009/0227061 A1* | 9/2009 | Bateman et al. ................ 438/57 |
| 2009/0227095 A1* | 9/2009 | Bateman et al. .............. 438/514 |
| 2009/0266401 A1* | 10/2009 | Stangl et al. .................. 136/244 |
| 2009/0308438 A1* | 12/2009 | De Ceuster et al. .......... 136/255 |
| 2010/0055822 A1* | 3/2010 | Weidman et al. ............... 438/57 |
| 2010/0193027 A1* | 8/2010 | Ji et al. .......................... 136/256 |
| 2011/0000532 A1 | 1/2011 | Niira et al. |
| 2011/0143480 A1* | 6/2011 | Hilali et al. ..................... 438/58 |

FOREIGN PATENT DOCUMENTS

| | | | |
|---|---|---|---|
| CN | 101401215 A | 4/2009 | |
| EP | 1 873 840 A1 | 1/2008 | |
| JP | 2003-152207 A | 5/2003 | |
| JP | 2004-39751 A | 2/2004 | |
| JP | 2009-524916 A | 7/2009 | |
| KR | 10-2005-0039273 A | 4/2005 | |
| KR | 2007-0079749 A | 8/2007 | |
| KR | 100757797 B1 | 9/2007 | |
| KR | 10-2010-0068832 A | 6/2010 | |
| WO | WO 2007/140763 * | 12/2007 | ............ H01L 31/068 |
| WO | WO 2008/050889 * | 5/2008 | .............. H01L 31/04 |
| WO | WO 2009010585 A2 * | 1/2009 | .......... H01L 31/0236 |
| WO | WO 2009/096539 A1 | 8/2009 | |
| WO | WO 2009/101107 A1 | 8/2009 | |

\* cited by examiner

SOLAR CELL AND METHOD FOR MANUFACTURING THE SAME

This application claims priority to and the benefit of Korean Patent Application No. 10-2009-0084046, 10-2010-0043961 and 10-2010-0075028 filed in the Korean Intellectual Property Office on Sep. 7, 2009, May 11, 2010, and Aug. 3, 2010, respectively. The contents of which are incorporated herein by reference.

BACKGROUND OF THE INVENTION

1. Field of the Invention

Embodiments of the invention relate to a solar cell and a method for manufacturing the same.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts that have different conductive types, such as a p-type and an n-type, and form a p-n junction, and electrodes respectively connected to the semiconductor parts of the different conductive types.

When light is incident on the solar cell, a plurality of electron-hole pairs are generated in the semiconductor parts. The electron-hole pairs are separated into electrons and holes by the photovoltaic effect. Thus, the separated electrons move to the n-type semiconductor and the separated holes move to the p-type semiconductor, and then the electrons and holes are collected by the electrodes electrically connected to the n-type semiconductor and the p-type semiconductor, respectively. The electrodes are connected to each other using electric wires to thereby obtain electric power.

SUMMARY OF THE INVENTION

In one aspect there is a solar cell including a substrate that contains first impurities of a first conductive type and is formed of a crystalline semiconductor, a first field region that is positioned on an incident surface of the substrate, and contains second impurities of a second conductive type, an emitter region that contains third impurities of a third conductive type, is formed of a non-crystalline semiconductor, and is positioned on a non-incident surface of the substrate opposite the incident surface of the substrate, a first electrode electrically connected to the emitter region, and a second electrode electrically connected to the substrate.

The solar cell may further include a first passivation layer positioned between the substrate and the first field region.

A concentration of the second impurities contained in the first field region may be higher than a concentration of the first impurities contained in the substrate. The concentration of the second impurities contained in the first field region may be approximately $1 \times 10^{16}$ atoms/cm$^3$ to $1 \times 10^{21}$ atoms/cm$^3$.

The first field region may have a thickness of 1 nm to 20 nm, and the first passivation layer may have a thickness of approximately 2 nm to 20 nm.

A concentration of the second impurities contained in the first field region may vary over a thickness of the first field region. The concentration of the second impurities contained in the first field region may increase from a contact surface between the first passivation layer and the first field region to an upper surface of the first field region. A minimum concentration of the second impurities of the first field region may be approximately $1 \times 10^{10}$ atoms/cm$^3$, and a maximum concentration of the second impurities of the first field region may be approximately $1 \times 10^{21}$ atoms/cm$^3$.

The first field region may have a thickness of 3 nm to 30 nm, and the first passivation layer may have a thickness of approximately 1 nm to 10 nm.

The first field region may be formed of amorphous silicon, amorphous silicon oxide, or amorphous silicon carbide.

The first passivation layer may be formed of intrinsic amorphous silicon.

The solar cell may further include a second field region that is positioned in the non-incident surface of the substrate to be separated from the emitter region. The second field region may have the same conductive type as the first field region.

The first conductive type may be the same as the second conductive type and may be opposite to the third conductive type.

The solar cell may further include a second passivation layer positioned on the non-incident surface of the substrate. The second passivation layer may be positioned on the substrate between the emitter region and the second field region. The second passivation layer may be positioned under the emitter region and under the second field region.

In another aspect, there is a solar cell including a substrate of a first conductive type, and is formed of a crystalline semiconductor, a field region of the first conductivity type and is positioned on an incident surface of the substrate, an anti-reflection layer directly positioned on the field region, an emitter region of a second conductive type different from the first conductive type, is formed of a non-crystalline semiconductor, and is positioned on a non-incident surface of the substrate opposite the incident surface of the substrate, a first electrode electrically connected to the emitter region, and a second electrode electrically connected to the substrate.

A concentration of impurities contained in the field region may be higher than a concentration of impurities contained in the substrate. The concentration of the impurities contained in the field region may be approximately $1 \times 10^{16}$ atoms/cm$^3$ to $1 \times 10^{21}$ atoms/cm$^3$.

The anti-reflection layer may be formed of at least one of silicon nitride, silicon oxide, and transparent metal oxide.

The solar cell may further include a passivation layer positioned between the substrate and the field region.

In another aspect, there is a method for manufacturing a solar cell including forming an emitter region containing first conductivity type impurities on a first surface of a substrate, forming a first field region containing second conductivity type impurities on the first surface of the substrate so that the first field region is separated from the emitter region, forming a passivation layer on a second surface, on which light is incident, opposite the first surface of the substrate, forming a second field region containing the second conductivity type impurities on the passivation layer, and forming a first electrode connected to the emitter region and a second electrode connected to the first field region.

A conductive type of the first conductivity type impurities may be opposite to a conductive type of the second conductivity type impurities.

The forming of the second field region may include keeping an injection rate of the second conductivity type impurities injected into a process chamber constant or varying the injection rate of the second conductivity type impurities injected into the process chamber as time has passed.

The substrate may be formed of a crystalline semiconductor, and the emitter region may be formed of a non-crystalline semiconductor.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
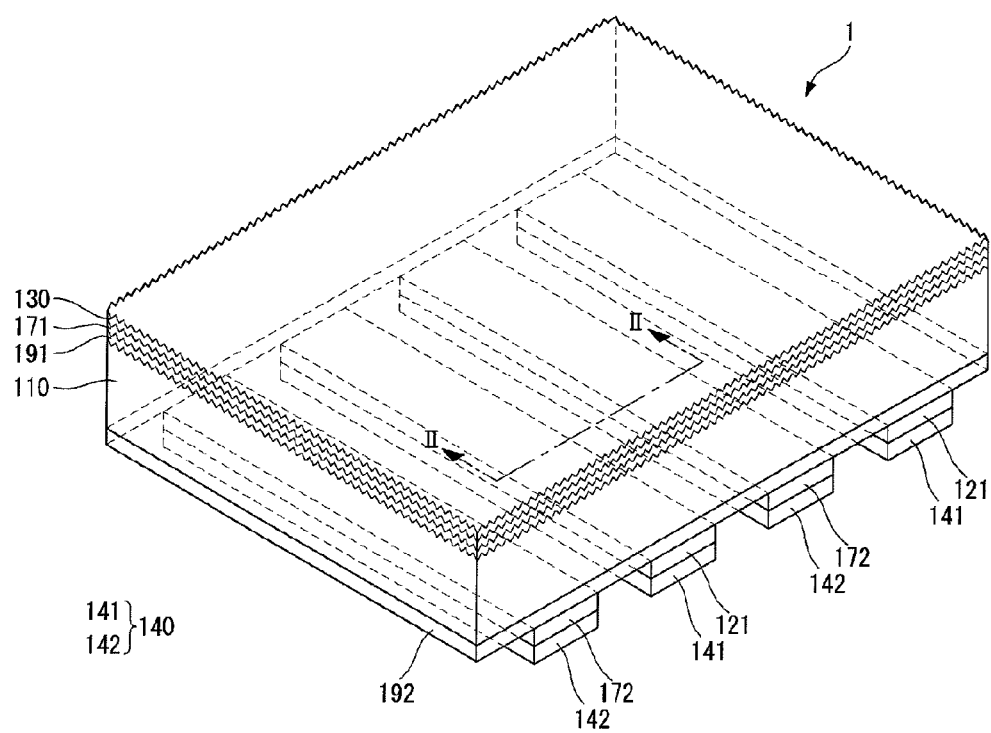
FIG. 1 is a partial perspective view of a solar cell according to an example embodiment of the invention.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

A solar cell according to an example embodiment of the invention is described in detail with reference to FIGS. 1 and 2.

FIG. 1 is a partial perspective view of a solar cell according to an example embodiment of the invention. FIG. 2 is a cross-sectional view taken along line II-II of FIG. 1.

Figure 2:
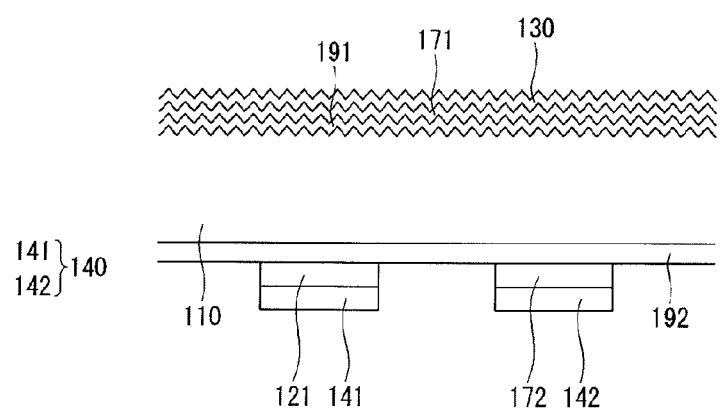
FIG. 2 is a cross-sectional view taken along line II-II of FIG. 1.

As shown in FIGS. 1 and 2, a solar cell 1 according to an example embodiment of the invention includes a substrate 110, a front passivation layer 191 positioned on an incident surface (hereinafter, referred to as "a front surface") of the substrate 110 on which light is incident, a front surface field (FSF) region 171 positioned on the front passivation layer 191, an anti-reflection layer 130 positioned on the FSF region 171, a back passivation layer 192 positioned on a surface (hereinafter, referred to as "a back surface") of the substrate 110, on which the light is not incident, opposite the front surface of the substrate 110, a plurality of emitter regions 121 positioned on the back passivation layer 192, a plurality of back surface field (BSF) regions 172 that are positioned on the back passivation layer 192 to be separated from the plurality of emitter regions 121, and an electrode part 140 including a plurality of first electrodes 141 respectively positioned on the plurality of emitter regions 121 and a plurality of second electrodes 142 respectively positioned on the plurality of BSF regions 172.

The substrate 110 is a semiconductor substrate formed of first conductive type silicon, for example, n-type silicon, though not required. Silicon used in the substrate 110 may be crystalline silicon such as single crystal silicon and polycrystalline silicon. When the substrate 110 is of an n-type, the substrate 110 is doped with impurities of a group V element such as phosphor (P), arsenic (As), and antimony (Sb). Alternatively, the substrate 110 may be of a p-type, and/or be formed of another semiconductor materials other than silicon. When the substrate 110 is of the p-type, the substrate 110 is doped with impurities of a group III element such as boron (B), gallium (Ga), and indium (In).

The front surface of the substrate 110 may be textured to form a textured surface corresponding to an uneven surface or having uneven characteristics. For convenience, FIG. 1 shows that only an edge portion of the substrate 110 has the textured surface and only edge portions of the front passivation layer 191, the FSF region 171, and the anti-reflection layer 130 on the front surface of the substrate 110 have the textured surface. However, the entire front surface of the substrate 110 has really the textured surface, and thus the front passivation layer 191, the FSF region 171, and the anti-reflection layer 130 on the front surface of the substrate 110 have the textured surface.

The back surface as well as the front surface of the substrate 110 may have a textured surface. In this instance, all of the back passivation layer 192, the plurality of emitter regions 121, the plurality of BSF regions 172, and the electrode part 140 positioned on the back surface of the substrate 110 may have an uneven surface.

The front passivation layer 191 on the front surface of the substrate 110 is formed of intrinsic amorphous silicon (a-Si). The front passivation layer 191 performs a passivation operation that converts a defect, for example, dangling bonds existing on the surface of the substrate 110 and around the surface of the substrate 110 into stable bonds to thereby prevent or reduce a recombination and/or a disappearance of carriers moving to the front surface of the substrate 110 resulting from the defect. Hence, the front passivation layer 191 reduces a loss amount of carriers caused to disappear by the defect on or around the surface of the substrate 110.

In general, the defect mostly exists on or around the surface of the substrate 110. Thus, in the embodiment of the invention, because the front passivation layer 191 directly contacts the surface of the substrate 110, a passivation effect is further improved. Hence, a loss amount of carriers is further reduced.

In the embodiment of the invention, the front passivation layer 191 may have a thickness of approximately 1 nm to 20 nm. When the thickness of the front passivation layer 191 is equal to or greater than approximately 1 nm, the passivation operation may be well performed because the front passivation layer 191 is uniformly applied to the front surface of the substrate 110. When the thickness of the front passivation layer 191 is equal to or less than approximately 20 nm, an amount of light absorbed in the front passivation layer 191 is reduced. Hence, an amount of light incident in the substrate 110 may increase.

The FSF region 171 on the front passivation layer 191 is an impurity region that is more heavily doped with impurities of the same conductive type (for example, the n-type) as the substrate 110 than the substrate 110. In the embodiment of the invention, an impurity concentration of the FSF region 171 may be at least approximately $1 \times 10^{10}$ atoms/cm$^3$ and may be at most approximately $1 \times 10^{21}$ atoms/cm$^3$. The FSF region 171 may be formed of amorphous silicon, amorphous silicon oxide (a-SiOx), or amorphous silicon carbide (a-SiC).

The movement of carriers (for example, holes) to the front surface of the substrate 110 is prevented or reduced by a potential barrier resulting from a difference between impurity concentrations of the substrate 110 and the FSF region 171. Thus, a front surface field effect is obtained by returning the carriers moving to the front surface of the substrate 110 to the back surface of the substrate 110 by the potential barrier. Hence, an output amount of carriers output to an external device increases, and a recombination and/or a disappearance of carriers at the front surface of the substrate 110 are prevented or reduced.

In general, energy band gaps of amorphous silicon oxide (a-SiOx) and amorphous silicon carbide (a-SiC) are approximately 2.1 eV and 2.8 eV, respectively. The energy band gaps are wide than amorphous silicon having an energy band gap of approximately 1.7 eV to eV 1.9. Thus, when the FSF region 171 is formed of amorphous silicon oxide (a-SiOx) or amorphous silicon carbide (a-SiC), a waveform region of light absorbed in the FSF region 171 decreases. Hence, an amount of light absorbed in the FSF region 171 decreases, and an amount of light incident on the substrate 110 further increases.

In the present embodiment, the impurity concentration of the FSF region 171 continuously or discontinuously changes in the range of approximately $1 \times 10^{10}$ atoms/cm$^3$ to $1 \times 10^{21}$ atoms/cm$^3$ along (or in) a thickness direction, or is substantially uniform in the range of approximately $1 \times 10^{16}$ atoms/cm$^3$ to $1 \times 10^{21}$ atoms/cm$^3$ along (or in) the thickness direction.

When the impurity concentration of the FSF region 171 changes in the range of approximately $1 \times 10^{10}$ atoms/cm$^3$ to $1 \times 10^{21}$ atoms/cm$^3$ along the thickness direction, a portion of the FSF region 171 performs the passivation operation in the same manner as the front passivation layer 191. In this instance, the impurity concentration of the FSF region 171 changes from an impurity concentration at a portion of the FSF region 171 adjoining the front passivation layer 191 to an impurity concentration at a portion of the FSF region 171 adjoining the anti-reflection layer 130.

For example, in the FSF region 171 that is closer to the front passivation layer 191, the impurity concentration of the FSF region 171 decreases. On the contrary, in the FSF region 171 that is closer to the anti-reflection layer 130, the impurity concentration of the FSF region 171 increases. A portion of the FSF region 171 positioned at a shortest distance between the portion of the FSF region 171 adjoining the front passivation layer 191 and the surface of the substrate 110, has a minimum impurity concentration. A portion of the FSF region 171 positioned at a shortest distance between the portion of the FSF region 171 adjoining the anti-reflection layer 130 and the surface of the substrate 110, has a maximum impurity concentration. In this instance, the two shortest distances are measured from the same portion or position of the substrate 110.

Accordingly, the minimum impurity concentration is approximately $1 \times 10^{10}$ atoms/cm$^3$, and the maximum impurity concentration is approximately $1 \times 10^{21}$ atoms/cm$^3$ in the FSF region 171.

In this instance, because the FSF region 171 performs the passivation operation as well as a front surface field operation, a thickness of the FSF region 171 has to be greater than a thickness of the FSF region when the FSF region performs only the front surface field operation. Further, a thickness of the front passivation layer 191 may slightly decrease. In this instance, the front passivation layer 191 may have a thickness of approximately 1 nm to 10 nm, and the FSF region 171 may have a thickness of approximately 3 nm to 30 nm.

When the thickness of the front passivation layer 191 is equal to or greater than approximately 1 nm, the passivation efficiency may further increase because the front passivation layer 191 is uniformly applied to the front surface of the substrate 110. When the thickness of the front passivation layer 191 is equal to or less than approximately 10 nm, an amount of light incident on the substrate 110 may further increase because the front passivation layer 191 performs the passivation operation without the absorption of light in the front passivation layer 191.

When the thickness of the FSF region 171 is equal to or greater than approximately 3 nm, the FSF region 171 may generate a field strength capable of stably performing the front surface field operation even if a portion of the FSF region 171 perform the passivation operation. Further, the FSF region 171 may form an electric field with a normal size irrespective of the presence of the front passivation layer 191, that is positioned between the substrate 110 and the FSF region 171 and which adversely affects a field strength reacting on (or applied to) the substrate 110, thereby stably performing the front surface field operation. When the thickness of the FSF region 171 is equal to or less than approximately 30 nm, an amount of light incident on the substrate 110 may further increase because the FSF region 171 performs the front surface field operation without the absorption of light in the FSF region 171.

Alternatively, when the FSF region 171 has substantially the uniform impurity concentration, the impurity concentration of the FSF region 171 may be substantially uniform irrespective of changes in the thickness of the FSF region 171. In this instance, because the FSF region 171 mainly performs the front surface field operation for the front surface field effect as compared with the passivation operation thereof, the FSF region 171 has to have the impurity concentration capable of smoothly performing the front surface field operation using the difference between the impurity concentrations of the substrate 110 and the FSF region 171.

Accordingly, when the FSF region 171 mainly performs the front surface field operation, the impurity concentration of the FSF region 171 has to be one that is higher than the impurity concentration of the FSF region 171 when the portion of the FSF region 171 performs the passivation operation. Further, the impurity concentration of the FSF region 171 may be higher than the impurity concentration of the substrate 110. In the present embodiment, the FSF region 171 has substantially the uniform impurity concentration belonging to the range of approximately $1 \times 10^{16}$ atoms/cm$^3$ to $1 \times 10^{21}$ atoms/cm$^3$.

When the FSF region 171 mainly performs the front surface field operation as compared with the passivation operation, the thickness of the front passivation layer 191 underlying the FSF region 171 may slightly increase for sake of the stable passivation operation, and the thickness of the FSF region 171 may slightly decrease because the FSF region 171 mainly performs the front surface field operation. Hence, the thickness of the front passivation layer 191 may be approximately 2 nm to 20 nm, and the thickness of the FSF region 171 may be approximately 1 nm to 20 nm.

When the thickness of the front passivation layer 191 is equal to or greater than approximately 2 nm, the defect existing on or around the surface of the substrate 110 may be completely removed by use of only the front passivation layer 191. Hence, the front passivation layer 191 may excellently perform the passivation operation. When the thickness of the front passivation layer 191 is equal to or less than approximately 20 nm, an amount of light incident on the substrate 110 may further increase because the front passivation layer 191 performs the passivation operation without the absorption of light in the front passivation layer 191.

When the thickness of the FSF region 171 is equal to or greater than approximately 1 nm, the FSF region 171 may form an electric field with the normal size irrespective of the presence of the front passivation layer 191, that is positioned between the substrate 110 and the FSF region 171, and which adversely affects the electric field strength reacting on or applied to the substrate 110, thereby stably performing the front surface field operation. When the thickness of the FSF region 171 is equal to or less than approximately 20 nm, an amount of light incident on the substrate 110 may further increase because the FSF region 171 performs the front surface field operation without the absorption of light in the FSF region 171.

The anti-reflection layer 130 on the FSF region 171 reduces a reflectance of light incident on the solar cell 1 and increases selectivity of a predetermined wavelength band, thereby increasing the efficiency of the solar cell 1.

The anti-reflection layer 130 may be formed of silicon oxide (SiOx) and/or silicon nitride (SiNx).

Further, the anti-reflection layer 130 may be formed using transparent metal oxide formed of at least one selected from the group consisting of indium tin oxide (ITO), tin (Sn)-based oxide (for example, $SnO_2$), zinc (Zn)-based oxide (for example, ZnO, ZnO:Al, ZnO:B, and AZO), and a combination thereof. A transparency and insulating characteristic of the transparent metal oxide vary depending on oxygen ($O_2$) content. Namely, as the $O_2$ content increase, a transparency of the transparent metal oxide increases and a transmittance of light increases. Further, when the $O_2$ content exceeds a predetermined content, the transparent metal oxide represents non-conductive characteristics because resistivity of the transparent metal oxide increases to an infinite value. Hence, the transparent metal oxide changes to an insulating material. Accordingly, the transparent metal oxide according to the embodiment of the invention is a transparent conductive oxide (TCO) or a transparent insulating oxide (TIO) depending on the $O_2$ content.

The transparency of the transparent metal oxide is greater than transparencies of silicon oxide (SiOx) and silicon nitride (SiNx). Thus, when the anti-reflection layer 130 is formed of the transparent metal oxide, an amount of light incident inside the substrate 110 further increases. Hence, the efficiency of the solar cell 1 is further improved.

In the present embodiment, the anti-reflection layer 130 has a singe-layered structure, but may have a multi-layered structure such as a double-layered structure in other embodiments. The anti-reflection layer 130 may be omitted, if desired.

The back passivation layer 192 directly positioned on the back surface of the substrate 110 performs the passivation operation in the same manner as the front passivation layer 191, thereby preventing or reducing a recombination and/or a disappearance of carriers moving to the back surface of the substrate 110.

The back passivation layer 192 may be formed of amorphous silicon in the same manner as the front passivation layer 191.

The back passivation layer 192 has a thickness to the extent that carriers moving to the back surface of the substrate 110 can pass through the back passivation layer 192 and can move to the BSF regions 172 and the emitter regions 121. In the present embodiment, the thickness of the back passivation layer 192 may be approximately 1 nm to 10 nm.

When the thickness of the back passivation layer 192 is equal to or greater than approximately 1 nm, the passivation effect may be further obtained or may be greater because the back passivation layer 192 is uniformly applied to the back surface of the substrate 110. When the thickness of the back passivation layer 192 is equal to or less than approximately 10 nm, an amount of light passing through the substrate 110 absorbed in the back passivation layer 192 is reduced. Hence, an amount of light again incident inside the substrate 110 may further increase.

Each of the plurality of BSF regions 172 is an impurity region that is more heavily doped with impurities of the same conductive type as the substrate 110 than the substrate 110. For example, each BSF region 172 may be an $n^+$-type region.

The plurality of BSF regions 172 extend parallel to one another on the back passivation layer 192 in a fixed direction to be separated from one another. In the present embodiment, the BSF regions 172 are formed of a non-crystalline semiconductor such as amorphous silicon.

The BSF regions 172 prevent or reduce the movement of holes to the BSF regions 172 used as a moving path of electrons by a potential barrier resulting from a difference between impurity concentrations of the substrate 110 and the BSF regions 172 in the same manner as the FSF region 171. Further, the BSF regions 172 facilitate the movement of carriers (for example, electrons) to the BSF regions 172. Thus, the BSF regions 172 reduce a loss amount of carriers by a recombination and/or a disappearance of electrons and holes in or around the BSF regions 172 or in the electrode part 140 and accelerate the movement of electrons to the BSF regions 172, thereby increasing an amount of electrons moving to the BSF regions 172.

Each BSF region 172 may have a thickness of approximately 10 nm to 25 nm. When the thickness of the BSF region 172 is equal to or greater than approximately 10 nm, the BSF region 172 may form a potential barrier sufficient to prevent or reduce the movement of holes to the BSF region 172 to thereby further reduce a loss amount of carriers. When the thickness of the BSF region 172 is equal to or less than approximately 25 nm, the BSF region 172 further reduces an amount of light absorbed in the BSF region 172 to thereby further increase an amount of light again incident inside the substrate 110.

The plurality of emitter regions 121 are positioned on the back surface of the substrate 110 to be separated from the BSF regions 172 and extend parallel to the BSF regions 172.

As shown in FIGS. 1 and 2, the plurality of emitter regions 121 and the plurality of BSF regions 172 are alternately positioned on the back surface of the substrate 110.

Each emitter region 121 is of a second conductive type (for example, a p-type) opposite a conductive type of the substrate 110. Each emitter region 121 is formed of a semiconductor, for example, amorphous silicon different from the substrate 110. Thus, the plurality of emitter regions 121 and the substrate 110 form a heterojunction as well as a p-n junction.

A plurality of electron-hole pairs produced by light incident on the substrate 110 are separated into electrons and holes by a built-in potential difference resulting from the p-n junction between the substrate 110 and the emitter regions 121. Then, the separated electrons move to the n-type semiconductor, and the separated holes move to the p-type semiconductor. Thus, when the substrate 110 is of the n-type and the emitter regions 121 are of the p-type, the separated holes pass through the back passivation layer 192 and move to the emitter regions 121 and the separated electrons pass through the back passivation layer 192 and move to the BSF regions 172 having the impurity concentration higher than the substrate 110.

Because the substrate 110 and each emitter region 121 form the p-n junction, the emitter region 121 may be of the n-type when the substrate 110 is of the p-type unlike the embodiment described above. In this instance, the separated electrons pass through the back passivation layer 192 and move to the emitter regions 121, and the separated holes pass through the back passivation layer 192 and move to the BSF regions 172.

When the plurality of emitter regions 121 are of the p-type, the emitter regions 121 may be doped with impurities of a group III element. On the contrary, when the emitter regions 121 are of the n-type, the emitter regions 121 may be doped with impurities of a group V element.

The plurality of emitter regions 121 may perform the passivation operation along with the back passivation layer 192. In this instance, an amount of carriers caused to disappear at the back surface of the substrate 110 by the defect is reduced, and thus the efficiency of the solar cell 11 is improved.

Each emitter region 121 may have a thickness of 5 nm to 15 nm. When the thickness of the emitter region 121 is equal to or greater than approximately 5 nm, the emitter region 121 may form a good p-n junction. When the thickness of the emitter region 121 is equal to or less than approximately 15 nm, an amount of light absorbed in the emitter region 121 is further reduced. Hence, an amount of light again incident inside the substrate 110 may further increase.

In the present embodiment, a crystallization phenomenon obtained when the emitter regions 121 and the BSF regions 172 are positioned on the back passivation layer 192 is reduced further than a crystallization phenomenon obtained when the emitter regions 121 and the BSF regions 172 are positioned directly on the substrate 110 formed of a crystalline semiconductor material, because the back passivation layer 192 is formed of intrinsic amorphous silicon (a-Si) in which there is no impurities or scarcely any impurities. Hence, characteristics of the emitter regions 121 and the BSF regions 172 positioned on an amorphous silicon layer (i.e., the back passivation layer 192) are improved.

The plurality of first electrodes 141 on the plurality of emitter regions 121 long extend along the emitter regions 121 and are electrically and physically connected to the emitter regions 121. Each first electrode 141 collects carriers (for example, holes) moving to the corresponding emitter region 121.

The plurality of second electrodes 142 on the plurality of BSF regions 172 long extend along the BSF regions 172 and are electrically and physically connected to the BSF regions 172. Each second electrode 142 collects carriers (for example, electrons) moving to the corresponding BSF region 172.

In FIGS. 1 and 2, the first and second electrodes 141 and 142 have the same plane shape or sheet shape as the emitter regions 121 and the BSF regions 172 underlying the first and second electrodes 141 and 142. However, they may have different plane shapes. As a contact area between the emitter regions 121 and the BSF regions 172 and the respective first and second electrodes 141 and 142 increases, a contact resistance therebetween decreases. Hence, the carrier transfer efficiency of the first and second electrodes 141 and 142 increases.

The plurality of first and second electrodes 141 and 142 may be formed of at least one conductive material selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used. As described above, because the plurality of first and second electrodes 141 and 142 are formed of the metal material, the plurality of first and second electrodes 141 and 142 reflect light passing through the substrate 110 onto the substrate 110.

The solar cell 1 having the above-described structure is a solar cell in which the plurality of first and second electrodes 141 and 142 are positioned on the back surface of the substrate 110, on which light is not incident, and the substrate 110 and the plurality of emitter regions 121 are formed of different kinds of semiconductors. An operation of the solar cell 1 is described below.

When light is irradiated onto the solar cell 1, sequentially passes through the anti-reflection layer 130, the FSF region 171, and the front passivation layer 191, and is incident on the substrate 110, a plurality of electron-hole pairs are generated in the substrate 110 by light energy based on the incident light. In this instance, because the front surface of the substrate 110 is the textured surface, a reflectance of light at the front surface of the substrate 110 is reduced. Further, because both a light incident operation and a light reflection operation are performed on the textured surface of the substrate 110, a light absorption increases and the efficiency of the solar cell 1 is improved. In addition, because a reflection loss of the light incident on the substrate 110 is reduced by the anti-reflection layer 130, an amount of light incident on the substrate 110 further increases.

The electron-hole pairs are separated into electrons and holes by the p-n junction of the substrate 110 and the emitter regions 121, and the separated holes move to the p-type emitter regions 121 and the separated electrons move to the n-type BSF regions 172. The holes moving to the p-type emitter regions 121 are collected by the first electrodes 141, and the electrons moving to the n-type BSF regions 172 are collected by the second electrodes 142. When the first electrodes 141 and the second electrodes 142 are connected to each other using electric wires, current flows therein to thereby enable use of the current for electric power.

Further, because the passivation layers 192 and 191 are positioned on the front surface as well as the back surface of the substrate 110, a loss amount of carriers caused to disappear by the defect on and around the front and back surfaces of the substrate 110 is reduced. Hence, the efficiency of the solar cell 1 is improved. In this instance, because the front passivation layer 191 as well as the back passivation layer 192 make direct contact with the surface of the substrate 110 in which the defect is frequently generated, the passivation effect is further improved.

Further, a loss amount of carriers is further reduced because of the FSF region 171 and the BSF region 172 respectively positioned on the front and back surfaces of the substrate 110, and thus the efficiency of the solar cell 1 is further improved.

Next, an energy band gap when the front passivation layer and the FSF region are formed on the front surface of the solar cell and an energy band gap when only the front passivation layer is formed on the front surface of the solar cell are described with reference to FIG. 8.

Figure 8:
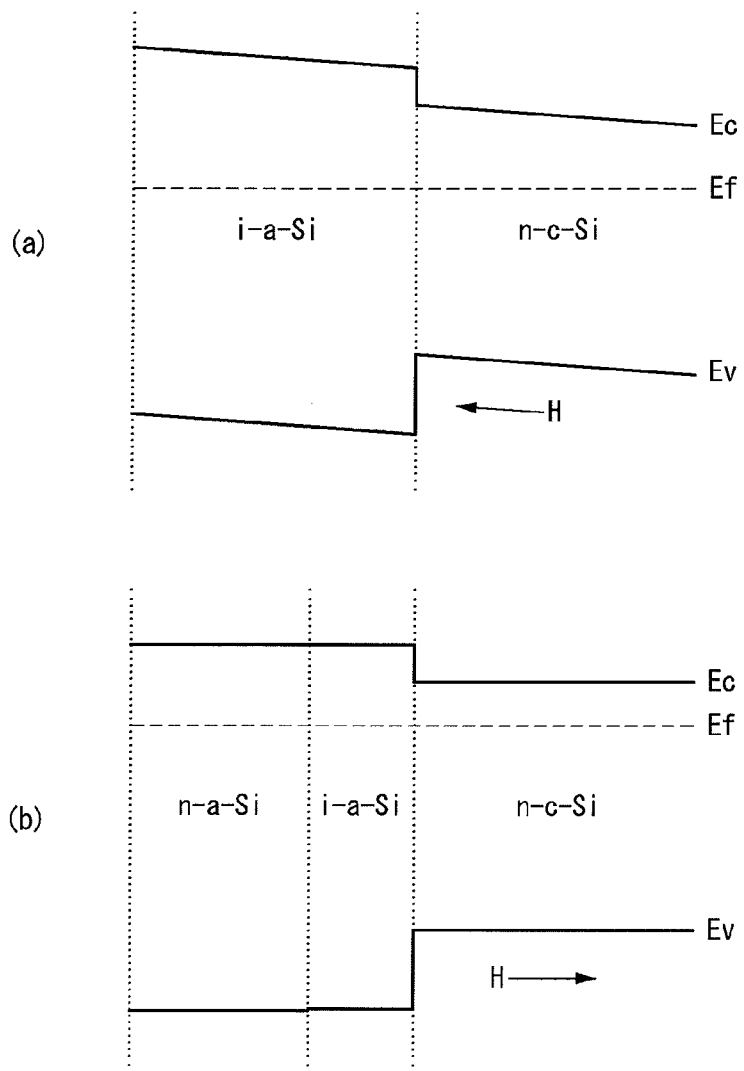
FIG. 8 schematically illustrates an energy band gap state of a substrate when a front surface field region is not positioned on the substrate and an energy band gap state of the substrate when the front surface field region is positioned on the substrate.

(a) of FIG. 8 illustrates an energy band gap between the substrate and the front passivation layer when only the front passivation layer without the FSF region is directly positioned on the substrate. (b) of FIG. 8 illustrates an energy band gap between the substrate and the front passivation layer and the FSF region when the front passivation layer and the FSF region are sequentially positioned on the substrate.

For a solar cell for measuring the energy band gap shown in FIG. 8, the front passivation layer is formed of intrinsic amorphous silicon (i-a-Si) having a thickness of approximately 20 nm, the FSF region is formed of n-type amorphous silicon (n-a-Si) having a thickness of approximately 10 nm and an impurity concentration of approximately $1 \times 10^{20}$ atoms/cm$^3$, and the substrate is formed of n-type polycrystalline silicon (n-c-Si).

As shown in (a) of FIG. 8, when the FSF region is not present, an energy band gap of the substrate (n-c-Si) was inclined. Therefore, holes H having the energy band gap characteristic moving from a low energy level to a high energy level mainly moved to the front passivation layer (i-a-Si), i.e., the front surface of the substrate (n-c-Si), and a loss of holes H occurred between the substrate (n-c-Si) and the front passivation layer (i-a-Si).

However, as shown in (b) of FIG. 8, when the FSF region (n-a-Si) existed, an energy band gap of the substrate (n-c-Si) was almost held in a parallel state because of an electric field formed by the FSF region (n-a-Si). Therefore, a directional behavior of holes H to move to the front surface of the substrate (n-c-Si) is not present. Hence, a loss of holes H generated between the substrate (n-c-Si) and the front passivation layer (i-a-Si) was greatly reduced.

When the FSF region is not present at the front surface of the substrate, a short-circuit current of the solar cell was approximately 28.47 mA/cm$^3$. When the FSF region is present at the front surface of the substrate, a short-circuit current of the solar cell was approximately 35.05 mA/cm$^3$. Namely, the short-circuit current of the solar cell increased by approximately 30%. The solar cells illustrated in (a) and (b) of FIG. 8 were manufactured under the same conditions, except the absence or presence of the FSF region. As above, a loss amount of carriers at the back surface of the substrate is greatly reduced by the operation of the FSF region, and thus the short-circuit current of the solar cell increases.

A method for manufacturing the solar cell 1 according to the embodiment of the invention is described below with reference to FIGS. 3A to 3J.

FIGS. 3A to 3J sequentially illustrate each of stages in a method for manufacturing the solar cell shown in FIG. 1.

Figure 3A:
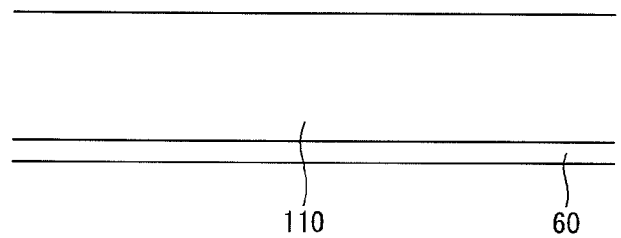
FIGS. 3A to 3J sequentially illustrate each of stages in a method for manufacturing the solar cell shown in FIG. 1.

As shown in FIG. 3A, an etch stop layer 60 formed of silicon oxide (SiOx), etc. is formed on the surface of the substrate 110 formed of n-type single crystal silicon or n-type polycrystalline silicon, for example.

Figure 3B:
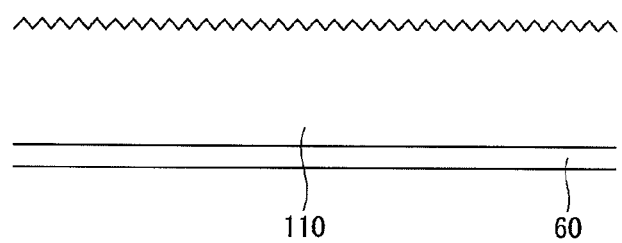

Next, as shown in FIG. 3B, the surface (for example, the incident surface) of the substrate 110, on which the etch stop layer 60 is not formed is etched, while another surface is protected using the etch stop layer 60 as a mask, to form a textured surface having a plurality of uneven portions on the front surface (for example, the incident surface) of the substrate 110. When the substrate 110 is formed of single crystal silicon, the front surface of the substrate 110 may be textured using a basic solution such as KOH, NaOH, and tetramethylammonium hydroxide (TMAH). On the other hand, when the substrate 110 is formed of polycrystalline silicon, the front surface of the substrate 110 may be textured using an acid solution such as HF and HNO$_3$.

If both the front surface and the back surface of the substrate 110 is to have the textured surface, the front surface and back surface of the substrate 110 may be exposed to an etchant or an etching gas without forming the etch stop layer 60 to form the textured surface on the front surface and the back surface of the substrate 110.

Figure 3C:
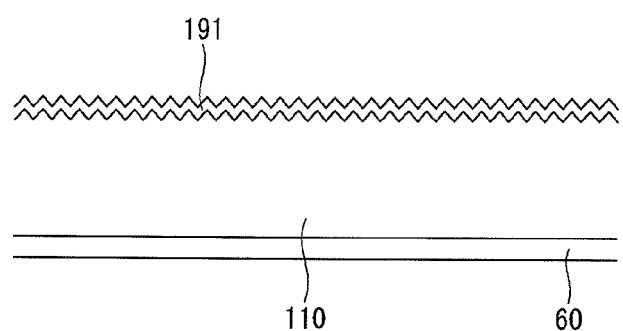

Next, as shown in FIG. 3C, the front passivation layer 191 formed of amorphous silicon is formed on the front surface (i.e., the textured surface) of the substrate 110 using a layer forming method such as a plasma enhanced chemical vapor deposition (PECVD) method.

Figure 3D:
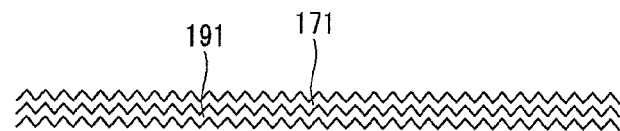
Figure 3D:
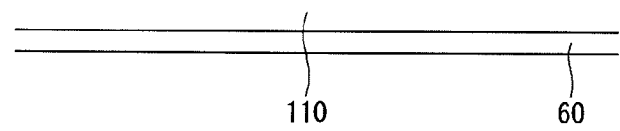

Next, as shown in FIG. 3D, the FSF region 171 formed of amorphous silicon is formed on the front passivation layer 191 using the PECVD method, etc. In this instance, because the FSF region 171 has the same conductive type as the substrate 110, an impurity doping material (for example, POCl$_3$ or H$_3$PO$_4$) containing impurities of a group V element such as phosphor (P) is injected into a process chamber. Hence, the FSF region 171, that has the same conductive type as the substrate 110 and has an impurity concentration higher than the substrate 110, is formed.

The FSF region 171 thus formed may have the uniform impurity concentration irrespective of its thickness. In this instance, the impurity concentration of the FSF region 171 is approximately $1 \times 10^{16}$ atoms/cm$^3$ to $1 \times 10^{21}$ atoms/cm$^3$. An injection rate of the impurity doping material injected into the process chamber for forming the FSF region 171 is substantially uniform.

However, alternatively, the impurity concentration of the FSF region 171 thus formed may change continuously or discontinuously over the thickness of the FSF region 171. In this instance, the impurity concentration of the FSF region 171 changes in the range of approximately $1 \times 10^{10}$ atoms/cm$^3$ to $1 \times 10^{21}$ atoms/cm$^3$ over its thickness. With greater thickness of the FSF region 171, there is an increase of the impurity concentration of the FSF region 171. An injection rate of the impurity doping material injected into the process chamber for forming the FSF region 171 increases with time.

Figure 3E:
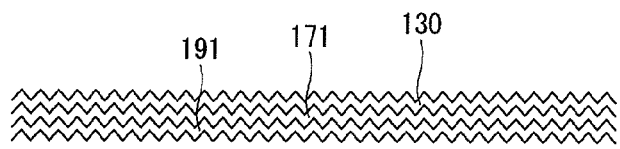
Figure 3E:
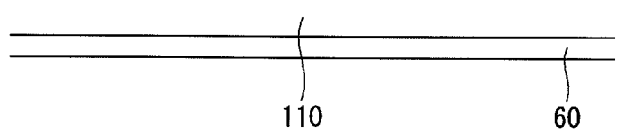

Next, as shown in FIG. 3E, the anti-reflection layer 130 formed of silicon oxide (SiOx) and/or silicon nitride (SiNx) is formed on the FSF region 171 using the PECVD method, etc.

Figure 3F:
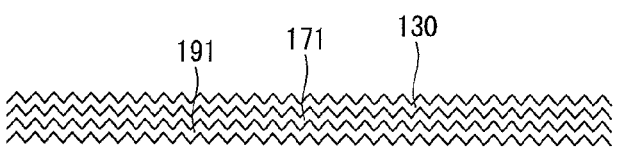
Figure 3F:
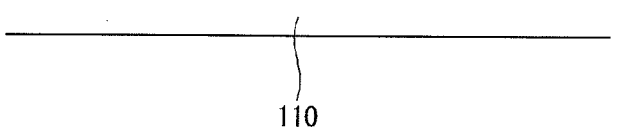

Next, as shown in FIG. 3F, the etch stop layer 60 formed on the back surface of the substrate 110 is removed.

Figure 3G:
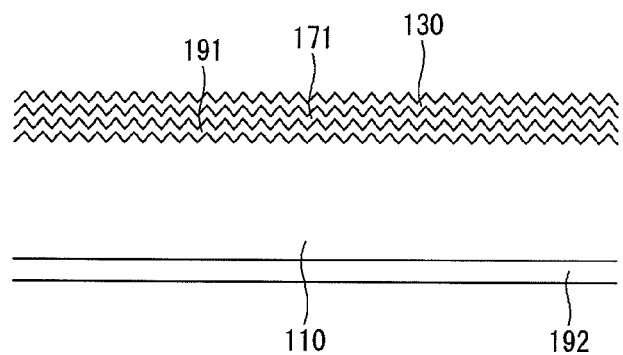

Next, as shown in FIG. 3G, the back passivation layer 192 is formed on the back surface of the substrate 110 using the PECVD method, etc. The back passivation layer 192 is formed of amorphous silicon, etc.

Figure 3H:
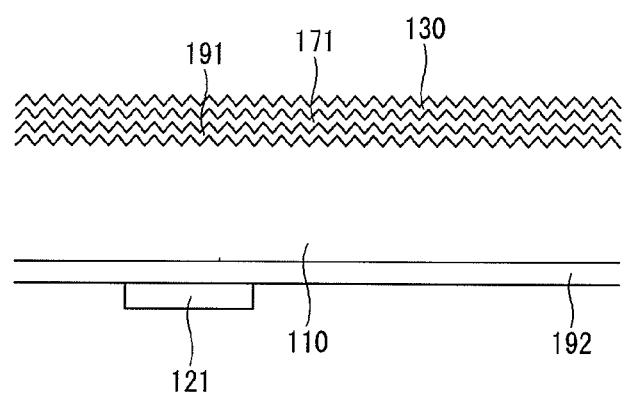

Next, as shown in FIG. 3H, after a mask having a plurality of openings is positioned on the back passivation layer 192, amorphous silicon is deposited using the PECVD method, etc., to form the plurality of emitter regions 121. When the plurality of emitter regions 121 are formed, an impurity doping material (for example, B$_2$H$_6$) containing impurities of a group III element such as boron (B) is injected into a process chamber. Therefore, the emitter regions 121 contain impurities of a conductivity type opposite the conductivity type of the substrate 110. Hence, the p-n junction between the substrate 110 and the plurality of emitter regions 121 is formed. Further, because the substrate 110 and the emitter regions 121 are formed of different semiconductor materials, the substrate 110 and the emitter regions 121 form the heterojunction.

Positions of the plurality of openings correspond to portions of the back passivation layer 192 on which the plurality of emitter regions 121 are formed, and thus the plurality of openings expose the portions of the back passivation layer 192 on which the plurality of emitter regions 121 are formed.

Figure 3I:
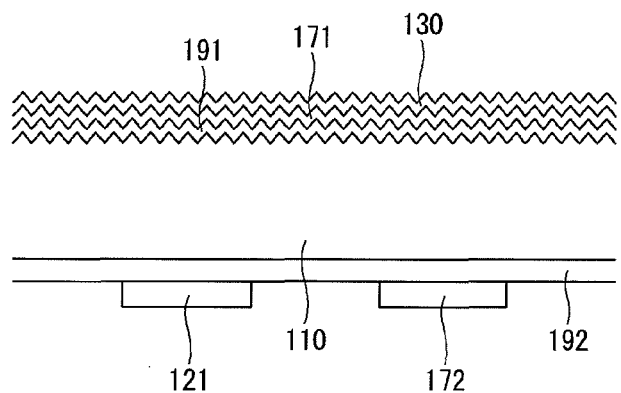

Next, as shown in FIG. 3I, after a mask having a plurality of openings is positioned on the back passivation layer 192, amorphous silicon is deposited using the PECVD method, etc., to form the plurality of BSF regions 172. Because the plurality of BSF regions 172 are formed by injecting an impurity doping material containing impurities of a group V element such as phosphor (P) into the process chamber, the plurality of BSF regions 172 become impurity regions having an impurity concentration higher than the substrate 110.

In this instance, positions of the plurality of openings correspond to portions of the back passivation layer 192 on which the plurality of BSF regions 172 are formed, and thus the plurality of openings expose the portions of the back passivation layer 192 on which the plurality BSF regions 172 are formed.

The formation order of the emitter regions 121 and the BSF regions 172 may vary. The emitter regions 121 and the BSF regions 172 may be formed using the following methods. For example, after a photosensitive layer is formed and a photomask is positioned on the photosensitive layer, the photosensitive layer of portions, on which the emitter regions 121 and the BSF regions 172 will be formed, is exposed. Hence, a desired portion of the back passivation layer 192 is exposed. As a result, the plurality of emitter regions 121 and the plurality of BSF regions 172 are formed in the exposed portion of the back passivation layer 192. Further, after an emitter layer, for example, an amorphous silicon layer containing corresponding impurities is formed on the back passivation layer 192, a portion of the emitter layer is selectively removed to form the plurality of emitter regions 121 on the back passivation layer 192. Then, after a BSF layer, for example, an amorphous silicon layer containing corresponding impurities is formed on the exposed back passivation layer 192 and the emitter regions 121, a portion of the BSF layer is selectively removed to form the plurality of BSF regions 172. As described above, the emitter regions 121 and the BSF regions 172 may be formed on the back passivation layer 192 using the various methods.

Figure 3J:
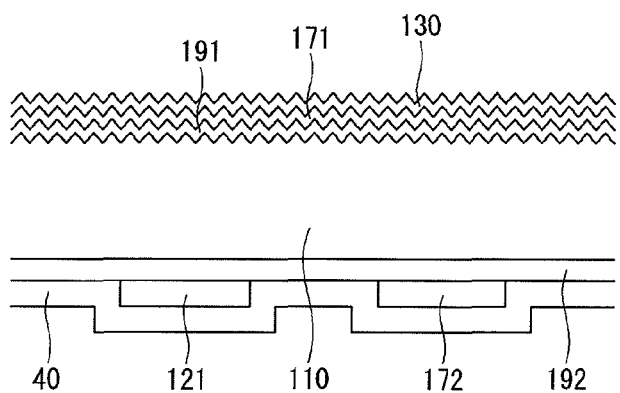

Next, as shown in FIG. 3J, a conductive layer 40 containing a metal material is formed on the exposed back passivation layer 192, the plurality of emitter regions 121, and the plurality of BSF regions 172 using the PECVD method, etc. Then, a portion of the conductive layer 40 is sequentially removed through a wet etching process using a mask to form the electrode part 140 (refer to FIGS. 1 and 2) including the plurality of first and second electrodes 141 and 142.

Instead of the deposition process illustrated in FIG. 3J, a paste containing a metal material may be applied on the plurality of emitter regions 121 and the plurality of BSF regions 172 using a screen printing method, and then dried. Hence, the electrode part 140 including the plurality of first electrodes 141 positioned on the plurality of emitter regions 121 and the plurality of second electrodes 142 positioned on the plurality of BSF regions 172 may be formed.

Alternatively, all of the layers 191, 171, 130, 192, 121, 172, 141, and 142 formed on the substrate 110 may be formed using a physical vapor deposition method such as a sputtering method as well as a chemical vapor deposition method such as the PECVD method.

As above, because the layers formed on the substrate 110 are formed using the chemical vapor deposition method or the physical vapor deposition method performed at a low temperature of approximately 200° C., the solar cell 1 may be easily manufactured, and characteristics of each of the layers 191, 171, 130, 192, 121, 172, 141, and 142 may be prevented from being degraded at a high temperature. As a result, the efficiency of the solar cell 1, or manufacture thereof, is improved.

A solar cell 1a according to another example embodiment of the invention is described below with reference to FIGS. 4 and 5.

Figure 4:
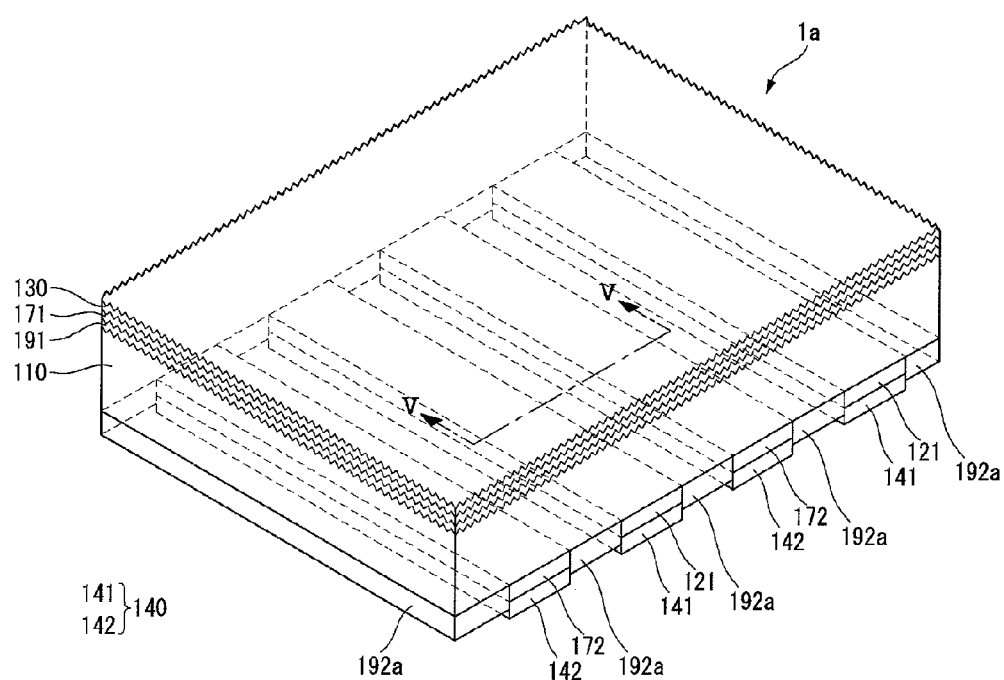
FIG. 4 is a partial perspective view of a solar cell according to another example embodiment of the invention.

FIG. 4 is a partial perspective view of a solar cell according to another example embodiment of the invention. FIG. 5 is a cross-sectional view taken along line V-V of FIG. 4. In the following description, structures and components identical or equivalent to those illustrated in FIGS. 1 and 2 are designated with the same reference numerals, and a further description may be briefly made or may be entirely omitted.

Figure 5:
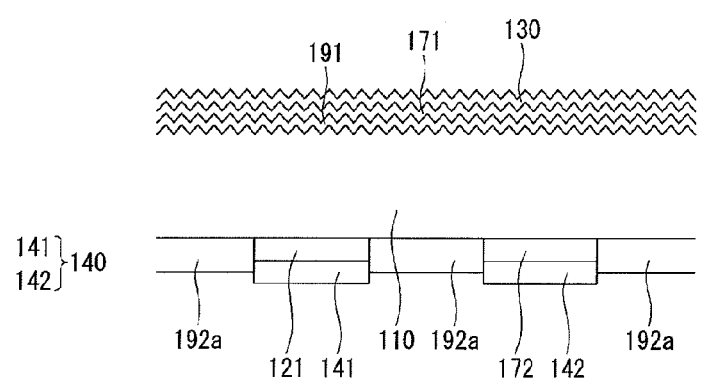
FIG. 5 is a cross-sectional view taken along line V-V of FIG. 4.

The solar cell 1a shown in FIGS. 4 and 5 has the structure similar to the solar cell 1 shown in FIGS. 1 and 2.

More specifically, the solar cell 1a according to the example embodiment of the invention includes a substrate 110, a front passivation layer 191, an FSF region 171, and an anti-reflection layer 130 that are sequentially positioned on a front surface of the substrate 110, a back passivation layer 192a, a plurality of emitter regions 121, and a plurality of BSF regions 172 that are positioned on a back surface of the substrate 110, and an electrode part 140 including a plurality of first electrodes 141 respectively positioned on the plurality of emitter regions 121 and a plurality of second electrodes 142 respectively positioned on the plurality of BSF regions 172.

Unlike the solar cell 1 shown in FIGS. 1 and 2, in the solar cell 1a shown in FIGS. 4 and 5, the plurality of emitter regions 121 and the plurality of BSF regions 172 are positioned to directly contact the back surface of the substrate 110. Further, the back passivation layer 192a is positioned on the back surface of the substrate 110 excluding a formation portion of the emitter regions 121 and the BSF regions 172 from the back surface of the substrate 110. In other words, the configuration of the solar cell 1a shown in FIGS. 4 and 5 is substantially the same as the solar cell 1 shown in FIGS. 1 and 2 except a formation location of the back passivation layer 192a.

The back passivation layer 192a shown in FIGS. 4 and 5 has a thickness greater than the back passivation layer 192 shown in FIGS. 1 and 2, but is not limited thereto.

The back passivation layer 192a performs a passivation operation on and around the surface of the substrate 110 in the same manner as the back passivation layer 192, thereby reducing a loss amount of carriers caused to disappear by the defect on or around the surface of the substrate 110.

The back passivation layer 192a is formed of an insulating material such as silicon oxide (SiOx) and silicon nitride (SiNx). Thus, an electrical interference (for example, carrier movement) between the emitter region 121 and the BSF region 172 adjacent to each other is prevented or reduced by the back passivation layer 192a, and as a result, a loss amount of carriers is reduced. Further, light passing through the substrate 110 is prevented or reduced from being reflected inside the substrate 110, and thus an amount of light reflected to the outside is reduced.

As above, because the plurality of emitter regions 121 and the plurality of BSF regions 172 directly contact the back surface of the substrate 110, a transfer rate of carriers moving to the emitter regions 121 and the BSF regions 172 increases. Hence, the efficiency of the solar cell 1a is further improved.

A solar cell 1b according to another example embodiment of the invention is described below with reference to FIGS. 6 and 7.

Figure 6:
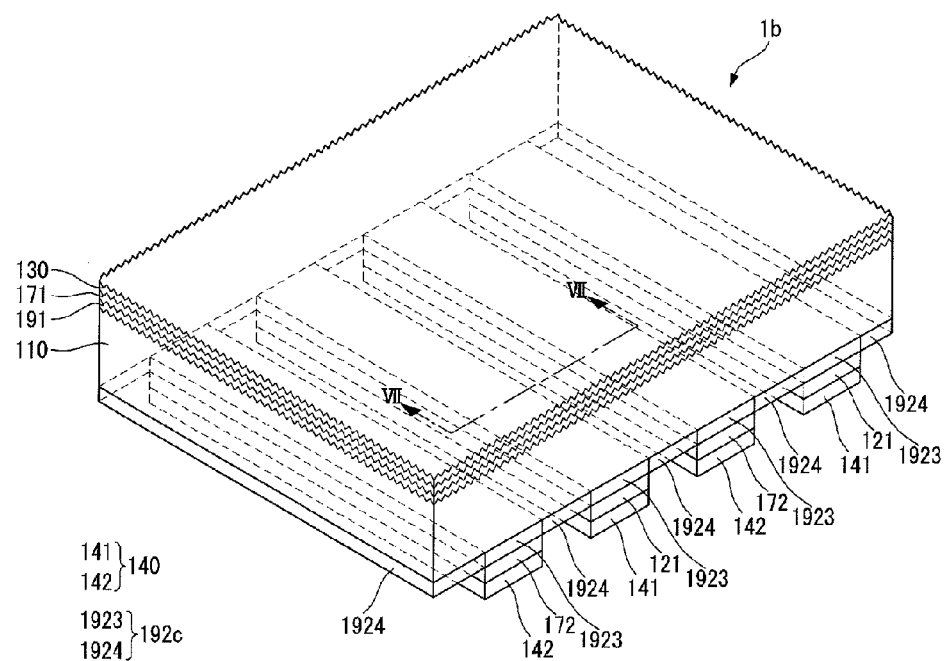
FIG. 6 is a partial perspective view of a solar cell according to another example embodiment of the invention.

FIG. 6 is a partial perspective view of a solar cell according to another example embodiment of the invention. FIG. 7 is a cross-sectional view taken along line VII-VII of FIG. 6. In the following description, structures and components identical or equivalent to those illustrated in FIGS. 1 and 2 are designated with the same reference numerals, and a further description may be briefly made or may be entirely omitted.

Figure 7:
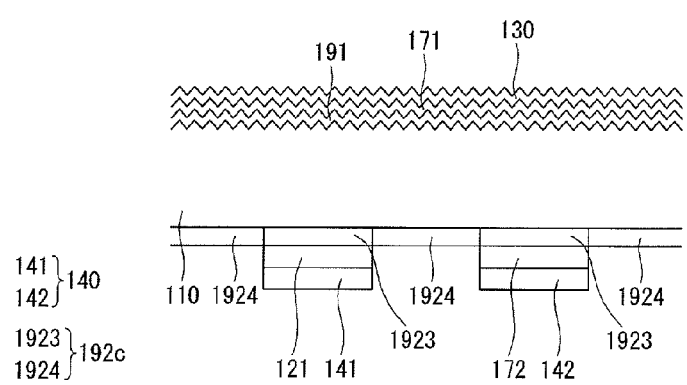
FIG. 7 is a cross-sectional view taken along line VII-VII of FIG. 6.

Similar to the solar cell 1 shown in FIGS. 1 and 2, the solar cell 1b shown in FIGS. 6 and 7 includes a substrate 110, a front passivation layer 191, an FSF region 171, and an anti-reflection layer 130 that are sequentially positioned on a front surface of the substrate 110, a back passivation layer 192c positioned on a back surface of the substrate 110, a plurality of emitter regions 121 and a plurality of BSF regions 172 positioned on the back passivation layer 192c, and an electrode part 140 including a plurality of first electrodes 141 respectively positioned on the plurality of emitter regions 121 and a plurality of second electrodes 142 respectively positioned on the plurality of BSF regions 172.

In the solar cell 1b shown in FIGS. 6 and 7, unlike the solar cell 1 shown in FIGS. 1 and 2, the back passivation layer 192c includes a plurality of first back passivation layers 1923 positioned between the substrate 110 and the plurality of emitter regions 121, and between the substrate 110 and the plurality of BSF regions 172; and a plurality of second back passivation layers 1924 positioned in other portions of the back surface of the substrate 110, i.e., between the plurality of emitter regions 121 and the plurality of BSF regions 172.

The first back passivation layers 1923 are formed of a conductive material such as amorphous silicon, and the second back passivation layers 1924 are formed of an insulating material such as silicon oxide (SiOx) and silicon nitride (SiNx). Hence, a conversion rate capable of converting unstable bonds existing at a contact surface between the back passivation layer 192c and the substrate 110 into stable bonds is improved. Further, an amount of carriers transferred to the emitter regions 121 or the BSF regions 172 increases because of conductive characteristics of the first back passivation layers 1923, and thus a carrier transfer rate increases. As a result, the efficiency of the solar cell 1b is further improved compared with the solar cell 1.

Further, as described above with reference to FIGS. 4 and 5, an electrical interference (for example, carrier movement) between the emitter region 121 and the BSF region 172 adjacent to each other is prevented or reduced by the second back passivation layers 1924, and as a result, the efficiency of the solar cell 1b is further improved.

In the solar cell 1b shown in FIGS. 6 and 7, thicknesses of the first and second back passivation layers 1923 and 1924 are substantially equal to each other, but may also be different from each other. For example, the thickness of the second back passivation layer 1924 may be greater than the thickness of the first back passivation layer 1923. In this instance, an electrical interference between the emitter region 121 and the BSF region 172 adjacent to each other is further reduced by the second back passivation layer 1924.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell, comprising:
a substrate that contains first impurities of a first conductive type, and is formed of a crystalline semiconductor;
a first passivation layer directly positioned on an incident surface of the substrate;
a first field region that is directly positioned on the first passivation layer, and contains second impurities of the first conductive type, the first field region being formed of amorphous silicon, amorphous silicon oxide, or amorphous silicon carbide;
an anti-reflection layer directly positioned on the first field region;
an emitter region that contains third impurities of a second conductive type opposite the first conductive type, is formed of a non-crystalline semiconductor, and is positioned on a non-incident surface of the substrate opposite the incident surface of the substrate;
a second passivation layer positioned on the non-incident surface of the substrate;
a second field region that is positioned at the non-incident surface of the substrate to be separated from the emitter region, wherein the second field region has the same conductive type as the first field region;
a first electrode electrically connected to the emitter region; and
a second electrode electrically connected to the second field region,
wherein a concentration of the second impurities contained in the first field region is $1\times10^{16}$ atoms/cm$^3$ to $1\times10^{21}$ atoms/cm$^3$,
the second passivation layer comprises first back passivation layers positioned between the substrate and the emitter region and between the substrate and the second field region, and a second back passivation layer exclusively and entirely positioned on the back surface of the substrate between the emitter region and the second field region,
the first back passivation layers are formed of amorphous silicon, and
the second back passivation layer is formed of at least one of silicon oxide (SiOx) and silicon nitride (SiNx).

2. The solar cell of claim 1, wherein the concentration of the second impurities contained in the first field region is higher than a concentration of the first impurities contained in the substrate.

3. The solar cell of claim 1, wherein the first field region has a thickness of 1 nm to 20 nm.

4. The solar cell of claim 1, wherein the first passivation layer has a thickness of 2 nm to 20 nm.

5. The solar cell of claim 1, wherein the concentration of the second impurities contained in the first field region is decreased towards the first passivation layer.

* * * * *